US012062399B2

(12) United States Patent
Choi

(10) Patent No.: US 12,062,399 B2
(45) Date of Patent: Aug. 13, 2024

(54) PAGE BUFFER CIRCUIT, SEMICONDUCTOR MEMORY APPARATUS INCLUDING PAGE BUFFER CIRCUIT, AND OPERATING METHOD OF SEMICONDUCTOR MEMORY APPARATUS

(71) Applicant: SK hynix Inc., Icheon-si Gyeonggi-do (KR)

(72) Inventor: Hyung Jin Choi, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 215 days.

(21) Appl. No.: 17/726,986

(22) Filed: Apr. 22, 2022

(65) Prior Publication Data

US 2023/0154546 A1 May 18, 2023

(30) Foreign Application Priority Data

Nov. 16, 2021 (KR) .................. 10-2021-0157771

(51) Int. Cl.
*G11C 16/26* (2006.01)
*G11C 16/04* (2006.01)
*G11C 16/10* (2006.01)
*G11C 16/34* (2006.01)

(52) U.S. Cl.
CPC .......... *G11C 16/26* (2013.01); *G11C 16/0483* (2013.01); *G11C 16/10* (2013.01); *G11C 16/3459* (2013.01)

(58) Field of Classification Search
CPC ..... G11C 16/26; G11C 16/0483; G11C 16/10; G11C 16/3459; G11C 2211/5643; G11C 2211/5648; G11C 2216/20; G11C 11/5628; G11C 11/5642; G11C 16/24; G11C 7/1057; G11C 7/106; G11C 7/065
USPC ..................................................... 365/230.03
See application file for complete search history.

(56) References Cited

U.S. PATENT DOCUMENTS

| 2017/0278580 | A1* | 9/2017 | Lim | ................. G06F 11/2094 |
| 2021/0072922 | A1* | 3/2021 | Shin | ................. G06F 3/0659 |
| 2021/0125673 | A1* | 4/2021 | Tachi | ................. G11C 11/5628 |
| 2022/0270697 | A1* | 8/2022 | Hwang | ............. G11C 16/0483 |
| 2023/0108845 | A1* | 4/2023 | Jang | ................. G11C 11/4074 |
| | | | | 365/185.21 |
| 2023/0145358 | A1* | 5/2023 | McNeil | ................. G06F 3/064 |
| | | | | 711/154 |

FOREIGN PATENT DOCUMENTS

| KR | 1020150017599 A | 2/2015 |
| KR | 1020210029551 A | 3/2021 |

* cited by examiner

*Primary Examiner* — Fernando Hidalgo
(74) *Attorney, Agent, or Firm* — William Park & Associates Ltd.

(57) ABSTRACT

A page buffer circuit includes a sensing latch circuit and a caching latch circuit. The sensing latch circuit is configured to receive and sense data that is stored in a memory cell during a normal read operation. The caching latch circuit is configured to receive and sense the data that is stored in the memory cell during a suspend read operation.

19 Claims, 5 Drawing Sheets

PAGE BUFFER CIRCUIT, SEMICONDUCTOR MEMORY APPARATUS INCLUDING PAGE BUFFER CIRCUIT, AND OPERATING METHOD OF SEMICONDUCTOR MEMORY APPARATUS

CROSS-REFERENCES TO RELATED APPLICATION

The present application claims priority under 35 U.S.C. § 119(a) to Korean application number 10-2021-0157771, filed on Nov. 16, 2021, in the Korean Intellectual Property Office, which is incorporated herein by reference in its entirety.

BACKGROUND

1. Technical Field

Various embodiments generally relate to a page buffer circuit, a semiconductor memory apparatus including the page buffer circuit, and an operating method of the semiconductor memory apparatus, and more particularly, to a page buffer circuit capable of performing a data read operation by using a caching latch circuit, a semiconductor memory apparatus including the page buffer circuit, and an operating method of the semiconductor memory apparatus.

2. Related Art

In general, a semiconductor memory apparatus is classified into a volatile memory device and a nonvolatile memory device. The volatile memory device and the nonvolatile memory device may perform a data processing operation of receiving power to store data or outputting the stored data. The volatile memory device has the advantage of high data processing operation speed but has the disadvantage of requiring continuous power to retain stored data. The nonvolatile memory device has the advantage of not requiring continuous power to retain stored data but has the disadvantage of low data processing operation speed.

As process and design technologies for a semiconductor memory apparatus are remarkably developed these days, the difference between the data processing speed of the volatile memory device and the data processing speed of the nonvolatile memory device has been greatly reduced. Accordingly, recently, the use of a nonvolatile memory device has increased.

A representative example of a nonvolatile memory device is a NAND type flash memory device having a string structure in which a plurality of memory cells are connected in series. The memory cell of the NAND type flash memory device includes a floating gate. Accordingly, the memory cell may store logic 'high' data or logic 'low' data by injecting electrons into the floating gate or emitting the electrons from the floating gate through a Fowler-Nordheim tunneling method.

A nonvolatile memory device including a NAND type flash memory device performs a program operation to store data in a memory cell and performs a read operation to output data that is stored in the memory cell. Furthermore, the nonvolatile memory device performs an erase operation to erase data that is stored in the memory cell before the program operation. Each of these program operation, read operation, and erase operation involves a verification operation. The verification operation is an operation of confirming whether desired data has been accurately stored in a memory cell according to the program operation, the read operation, and the erase operation.

Meanwhile, memory cells of a nonvolatile memory device are defined as single level cells, multi-level cells, triple level cells, quadruple level cells, and the like according to the number of distributions of data that is stored in one memory cell during a program operation. The single level cell has two data distributions that correspond to logic 'high' data or logic 'low' data, in correspondence to 1 bit. The multi-level cell has four data distributions that correspond to 2 bits, the triple level cell has eight data distributions that correspond to 3 bits, and the quadruple level cell has 16 data distributions that correspond to 4 bits.

On the other hand, a nonvolatile memory device generally performs a program operation, a read operation, and a verification operation on data by using a plurality of latch circuits. As the number of distributions of data that is stored in a memory cell increases, the number of a plurality of latch circuits generally increases. However, there is a limit to increasing the number of the plurality of latch circuits due to a chip area.

In relation to the above, a nonvolatile memory device supports a suspend read operation during a program operation. In general, for a suspend read operation, a separate storage space for the suspend read operation is additionally required. In other words, a nonvolatile memory device includes a separate latch circuit or a separate storage circuit for an additional storage space. Accordingly, a nonvolatile memory device needs an additional storage space for the suspend read operation and needs to perform a separate operation for driving the additional storage space.

SUMMARY

A page buffer circuit in accordance with an embodiment of the present disclosure may include: a sensing latch circuit configured to receive and sense data that is stored in a memory cell, during a normal read operation; and a caching latch circuit configured to receive data that is stored in the sensing latch circuit and output the received data as final data during the normal read operation, and configured to receive and sense the data that is stored in the memory cell and output the sensed data as the final data during a suspend read operation.

A semiconductor memory apparatus in accordance with an embodiment of the present disclosure may include: a memory device, including a plurality of page buffer circuits, configured to store data; and a memory control device configured to control the memory device. Each of the plurality of page buffer circuits may include a sensing latch circuit configured to receive and sense data that is stored in a memory cell during a normal read operation; and a caching latch circuit configured to receive data that is stored in the sensing latch circuit and output the received data as final data during the normal read operation and configured to receive and sense the data that is stored in the memory cell and output the sensed data as the final data during a suspend read operation.

An operating method of a semiconductor memory apparatus in accordance with an embodiment of the present disclosure may include: performing, through a memory device, a program operation; requesting the memory device to perform a suspend read operation; transferring data that is stored in a memory cell to a sensing node; sensing, through a caching latch circuit, the data transferred to the sensing node; and outputting data that corresponds to the suspend read operation.

DETAILED DESCRIPTION

Figure 1:
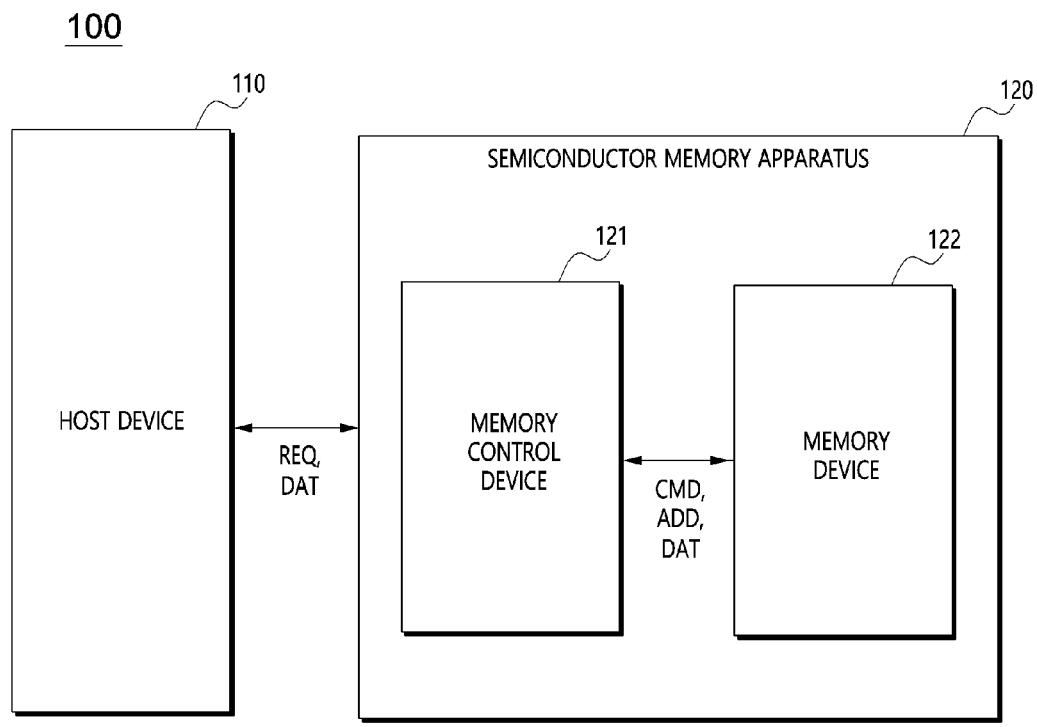
FIG. 1 is a block diagram illustrating the configuration of a semiconductor memory system in accordance with an embodiment of the present disclosure.

The description of the present disclosure is an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of the steps, symbols (e.g., a, b, and c) are used for convenience of description, and the symbols do not describe an order of the steps. The steps may be performed in an order different from the order described in the context unless a specific order is clearly described in the context. That is, the steps may be performed according to a described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as with the same meanings as those in the context in related technology and should not be construed as with ideal or excessively formal meanings, unless clearly defined in the application.

Various embodiments are directed to providing a page buffer circuit capable of performing a suspend read operation without a separate latch circuit or a separate storage circuit, a semiconductor memory apparatus including the page buffer circuit, and an operating method of the semiconductor memory apparatus.

In accordance with an embodiment of the present disclosure, an additional storage space is not required during a suspend read operation, which makes it possible to increase the area gain and operation efficiency that correspond to the additional storage space.

FIG. 1 is a block diagram illustrating the configuration of a semiconductor memory system 100 in accordance with an embodiment of the present disclosure.

Referring to FIG. 1, the semiconductor memory system 100 may be mounted on a mobile phone, a smart phone, an MP3 player, a laptop computer, a desktop computer, a game machine, a television, a tablet personal computer, an in-vehicle infotainment system, or the like. The semiconductor memory system 100 may include a host device 110 and a semiconductor memory apparatus 120.

The host device 110 may be configured to control the semiconductor memory apparatus 120. The host device 110 may control the semiconductor memory apparatus 120 based on request information REQ. For example, the host device 110 may transmit a data signal DAT together with the request information REQ. The host device 110 may receive the data signal DAT that corresponds to the request information REQ from the semiconductor memory apparatus 120.

The host device 110 and the semiconductor memory apparatus 120 may include various communication methods. Examples of various communication methods may include a universal serial bus (USB), a serial AT attachment (SATA), a small computer system interface (SCSI), a serial attached SCSI (SAS), a high-speed inter-chip (HSIC), a peripheral component interconnection (PCI), a PCI express (PCIe), a non-volatile memory express (NVMe), a universal flash storage (UFS), a secure digital (SD), a multi-media card (MMC), an embedded MMC (eMMC), a dual in-line memory module (DIMM), a registered DIMM (RDIMM), a load reduced DIMM (LRDIMM), and the like.

The semiconductor memory apparatus 120 may be configured to perform various operations under the control of the host device 110. For example, under the control of the host device 110, the semiconductor memory apparatus 120 may perform a program operation of storing data that corresponds to the data signal DAT or a read operation of outputting the stored data as the data signal DAT.

The semiconductor memory apparatus 120 may be configured as any one of various types of storage devices such as a multimedia card in the form of an SSD, an MMC, an eMMC, an RS-MMC, or a micro-MMC, a secure digital card in the form of an SD, a mini-SD, or a micro-SD, a universal serial bus (USB) device, a universal flash storage (UFS) device, a personal computer memory card international association (PCMCIA) device, a peripheral component interconnection (PCI) device, a PCI express (PCI-E) device, a compact flash (CF) card, a smart media card, and a memory stick.

The semiconductor memory apparatus 120 may be fabricated as any one of various types of packages. For example, the semiconductor memory apparatus 120 may be fabricated as any one of various types of packages such as a package on package (POP), a system in package (SIP), a system on chip (SOC), a multi-chip package (MCP), a package on board (COB), a wafer-level fabricated package (WFP), and a wafer-level stack package (WSP).

The semiconductor memory apparatus 120 may include a memory control device 121 and a memory device 122.

The memory control device 121 may be configured to control the memory device 122 based on the request information REQ that is transmitted from the host device 110. The memory control device 121 may control a program operation, a read operation, an erase operation, and the like on the memory device 122. The memory control device 121 may transmit a command signal CMD and an address signal ADD that corresponds to the program operation, the read operation, and the erase operation to the memory device 122. The read operation may include a normal read operation and a suspend read operation. The normal read operation may be an operation of outputting data that corresponds to a normal operation. The suspend read operation may be an operation of outputting data that corresponds to the suspend read operation when the memory device 122 is performing a program operation, for example. In other words, the memory control device 121 may generate a command signal CMD that corresponds to the normal read operation and the suspend read operation on the memory device 122 and may provide the command signal CMD to the memory device 122.

Subsequently, the memory device 122 may be configured to store data that corresponds to a data signal DAT based on the command signal CMD and the address signal ADD or configured to output the stored data as the data signal DAT. Although not illustrated in the drawing, the memory device 122 may include a plurality of memory cells for storing the data that corresponds to the data signal DAT. The memory cell may include memory blocks formed in an array form. The memory block may include a plurality of pages. The plurality of pages may be a unit by which data may be programed or read. The memory block may be a unit by which data may be erased. Furthermore, the memory device 122 may include a plurality of page buffer circuits, to be described below, to perform a program operation and a read operation on a memory cell.

The memory device 122 may be a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), or the like.

For convenience of description, it is assumed that the memory device 122 in accordance with an embodiment of the present disclosure is a NAND flash memory. The memory device 122 may be implemented in a two-dimensional array structure or a three-dimensional array structure. Furthermore, the memory device 122 may be implemented as a flash memory device in which a charge storage layer is configured as a conductive floating gate (FG) or a charge trap flash (CTF) in which a charge storage layer is configured as an insulating film.

The memory device 122 may receive the command signal CMD and the address signal ADD from the memory control device 121. The address signal ADD may indicate a location of a memory cell in which data is to be stored or has been stored. In other words, when the command signal CMD indicates a program operation, the memory device 122 may store data in a memory cell that corresponds to the address signal ADD. When the command signal CMD indicates a normal read operation, the memory device 122 may output data that is stored in the memory cell that corresponds to the address signal ADD. When the command signal CMD indicates a suspend read operation, the memory device 122 may output data that is stored in the memory cell that corresponds to the address signal ADD. Furthermore, when the command signal CMD indicates an erase operation, the memory device 122 may erase the memory cell that corresponds to the address signal ADD.

Figure 2:
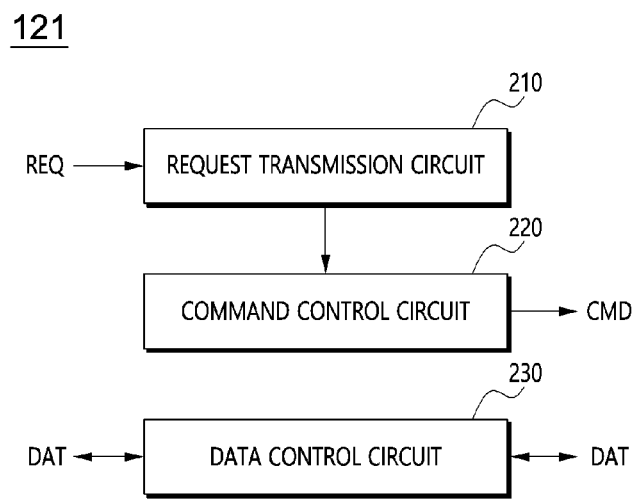
FIG. 2 is a block diagram illustrating the internal configuration of a memory control device in FIG. 1.

FIG. 2 is a block diagram illustrating the internal configuration of the memory control device 121 in FIG. 1.

Referring to FIG. 1 and FIG. 2, the memory control device 121 may include a request transmission circuit 210, a command control circuit 220, and a data control circuit 230.

The request transmission circuit 210 may receive the request information REQ from the host device 110 (see FIG. 1). The request transmission circuit 210 may receive the request information REQ even while the memory device 122 (see FIG. 1) performs a program operation. The received request information REQ may be, for example, request information REQ that corresponds to a suspend read operation. The request transmission circuit 210 may receive the request information REQ and transfer the received request information REQ to the command control circuit 220.

The request transmission circuit 210 may control a suspend read operation by calculating the time that is required until an operation that is performed by the memory device 122 (see FIG. 1) is completed. In other words, the request transmission circuit 210 may control the suspend read operation by comparing a latency value that corresponds to an operation being performed by the memory device 122 with a currently input latency value that corresponds to the suspend read operation. The request transmission circuit 210 may provide the command control circuit 220 with a result of comparing the latency values during the suspend read operation.

The command control circuit 220 may generate a command signal CMD based on an output signal received from the request transmission circuit 210. The command signal CMD may be a signal that corresponds to a program operation, a normal read operation, an erase operation, and a suspend read operation. The command control circuit 220 may transfer the generated command signal CMD to the memory device 122 (see FIG. 1).

Meanwhile, the data control circuit 230 may transmit/receive a data signal DAT to/from the host device 110 (see FIG. 1). The data control circuit 230 may transmit/receive the data signal DAT to/from the memory device 122 (see FIG. 1). Although not illustrated in the drawing, the data control circuit 230 may include a data input/output circuit for transmitting/receiving the data signal DAT, an error correction circuit for correcting an error that is included in the data signal DAT, and the like. As will be described below with reference to FIG. 5, the data control circuit 230 may receive data D_SPD that corresponds to a suspend read operation from the memory device 122 during the suspend read operation.

Figure 3:
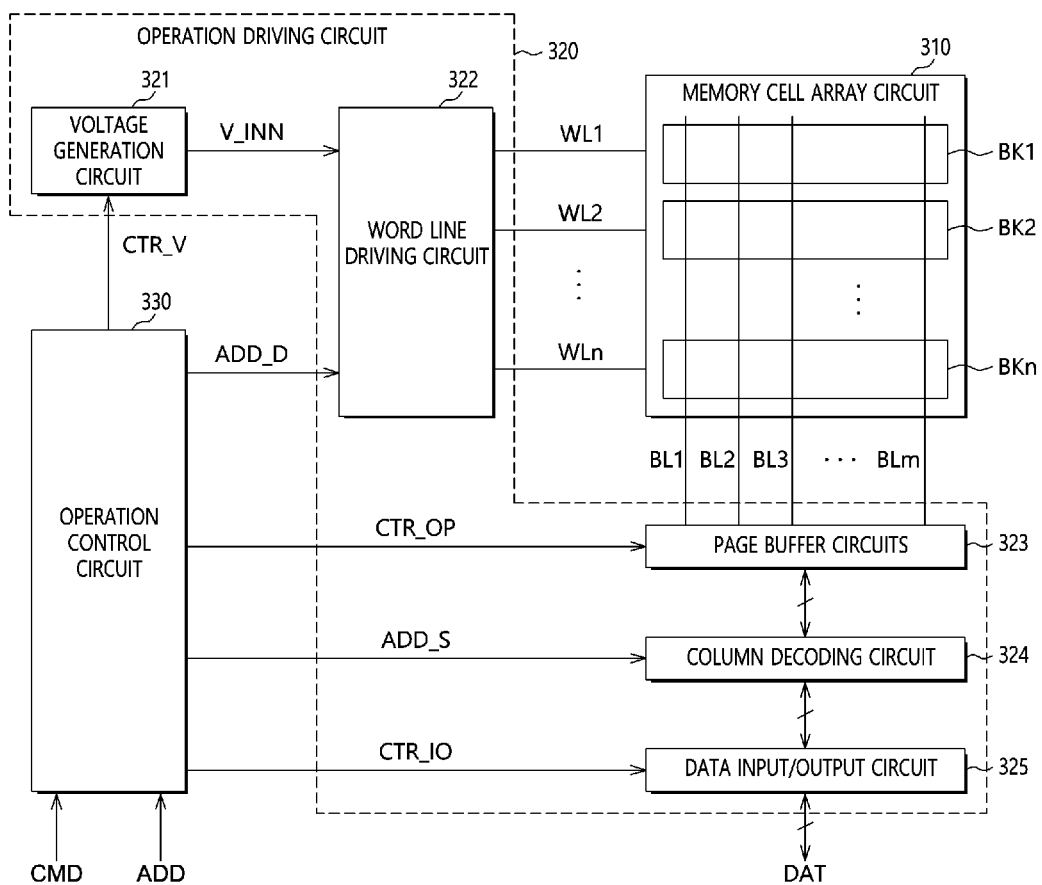
FIG. 3 is a block diagram illustrating the internal configuration of a memory device in FIG. 1.

FIG. 3 is a block diagram illustrating the internal configuration of the memory device 122 in FIG. 1.

Referring to FIG. 3, the memory device 122 may include a memory cell array circuit 310, an operation driving circuit 320, and an operation control circuit 330.

The memory cell array circuit 310 may be configured to store data. The memory cell array circuit 310 may include a plurality of memory block circuits BK1 to BKn (n is a natural number). Each of the memory block circuits BK1 to BKn may include a plurality of memory cells for storing data. The plurality of memory cells may have a string structure in which they are connected in series. The plurality of memory cells may be connected to a plurality of word lines WL1 to WLn and a plurality of bit lines BL1 to BLm (m is a natural number), respectively, to have a matrix structure. As will be described below, the plurality of word lines WL1 to WLn may be driven to a preset voltage by a word line driving circuit 322 according to a program operation, a read operation, an erase operation, and a verification operation. The plurality of bit lines BL1 to BLm may be driven at a preset voltage according to data that is stored or to be stored in the memory cell.

Next, the operation driving circuit 320 may be configured to be driven to perform a program operation, a read operation, an erase operation, and a verification operation on a target memory cell of the memory cell array circuit 310. The operation driving circuit 320 may include a voltage generation circuit 321, the word line driving circuit 322, a plurality of page buffer circuits 323, a column decoding circuit 324, and a data input/output circuit 325. Hereinafter, the respective components that are included in the operation driving circuit 320 will be described.

The voltage generation circuit 321 may be configured to generate internal voltages V_INN that are required for a program operation, a read operation, an erase operation, and a verification operation. The voltage generation circuit 321 may generate the internal voltages V_INN having various voltage levels that correspond to the respective operations based on a voltage control signal CTR_V that is generated by the operation control circuit 330.

The word line driving circuit 322 may be configured to selectively apply the internal voltages V_INN that are generated by the voltage generation circuit 321 to the plurality of word lines WL1 to WLn. The word line driving circuit 322 may receive the internal voltages V_INN from the voltage generation circuit 321 and may receive a driving address signal ADD_D from the operation control circuit 330. The driving address signal ADD_D may be a signal for selectively activating a corresponding word line of the plurality of word lines WL1 to WLn. Accordingly, the word line driving circuit 322 may activate each of the plurality of word lines WL1 to WLn based on the driving address signal ADD_D and the internal voltages V_INN and may drive the activated word line to a corresponding internal voltage V_INN.

Although not illustrated in the drawing, the word line driving circuit 322 may be connected to a drain selection line, a source selection line, and a common source line included in the memory cell array circuit 310. Accordingly, the word line driving circuit 322 may apply a preset internal voltage V_INN to each of the drain selection line, the source selection line, and the common source line according to a program operation, a read operation, an erase operation, and a verification operation.

For example, during the program operation, the word line driving circuit 322 may apply a program voltage, which is one of the internal voltages V_INN, to a word line that is selected from the plurality of word lines WL1 to WLn and may apply a program pass voltage having a voltage level that is lower than that of the program voltage to the remaining unselected word lines. During the read operation, the word line driving circuit 322 may apply a read voltage to a selected word line and may apply a read pass voltage having a voltage level that is higher than that of the read voltage to the unselected word lines. During the erase operation, the word line driving circuit 322 may apply a ground voltage to a selected word line. Furthermore, during the verification operation, the word line driving circuit 322 may apply a verification voltage, which is one of the internal voltages V_INN, to a selected word line and may apply a plurality of verification pass voltages having a voltage level that is higher than that of the verification voltage to the unselected word lines.

The plurality of page buffer circuits 323 may be connected to the memory cell array circuit 310 through the plurality of bit lines BL1 to BLm. The plurality of page buffer circuits 323 may be configured to transfer data to the plurality of bit lines BL1 to BLm during a program operation. Furthermore, the plurality of page buffer circuits 323 may be configured to receive data from the plurality of bit lines BL1 to BLm during a read operation. Each of the plurality of page buffer circuits 323 may be configured as a plurality of latch circuits. Each of the latch circuits may perform a program operation, a read operation, and a verification operation on input/output data based on an operation control signal CTR_OP that is generated by the operation control circuit 330.

Next, the column decoding circuit 324 may be configured to control the transfer path of the input/output data. The column decoding circuit 324 may receive data to be output from the plurality of page buffer circuits 323 and may receive data to be input from the data input/output circuit 325. Furthermore, the column decoding circuit 324 may receive a selection address signal ADD_S from the operation control circuit 330 and may control the transfer path of the input/output data. The selection address signal ADD_S may be a signal for selecting a corresponding bit line of the plurality of bit lines BL1 to BLm.

Next, the data input/output circuit 325 may be configured to control an input/output operation for a data signal DAT. The data input/output circuit 325 may perform a data input/output operation based on an input/output control signal CTR_IO that is generated by the operation control circuit 330. During a program operation, the data input/output circuit 325 may receive a data signal DAT based on the input/output control signal CTR_IO and may transfer the data signal DAT to the column decoding circuit 324. During a read operation, the data input/output circuit 325 may output data, which is output from the column decoding circuit 324, as a data signal DAT based on the input/output control signal CTR_IO.

Next, the operation control circuit 330 may be configured to control the voltage generation circuit 321, the word line driving circuit 322, the plurality of page buffer circuits 323, the column decoding circuit 324, and the data input/output circuit 325 that are included in the operation driving circuit 320. The operation control circuit 330 may generate the voltage control signal CTR_V for controlling the voltage generation circuit 321 based on the command signal CMD and the address signal ADD. Furthermore, the operation control circuit 330 may generate the driving address signal ADD_D to be provided to the word line driving circuit 322. Furthermore, the operation control circuit 330 may generate the operation control signal CTR_OP for controlling the plurality of page buffer circuits 323. Furthermore, the operation control circuit 330 may generate the selection address signal ADD_S for controlling the column decoding circuit 324. Furthermore, the operation control circuit 330 may generate the input/output control signal CTR_IO for controlling the data input/output circuit 325. The operation control circuit 330 may control the overall operation of the memory device 122.

In other words, the memory device 122 may perform the program operation, the read operation, the erase operation, the verification operation, and the like through the operation control circuit 330. As described above, the read operation may include the normal read operation and the suspend read operation. Accordingly, the memory device 122 may also perform the normal read operation and the suspend read operation through the operation control circuit 330.

Hereinafter, for more clear description, the normal read operation and the suspend read operation will be separately described.

Figure 4:
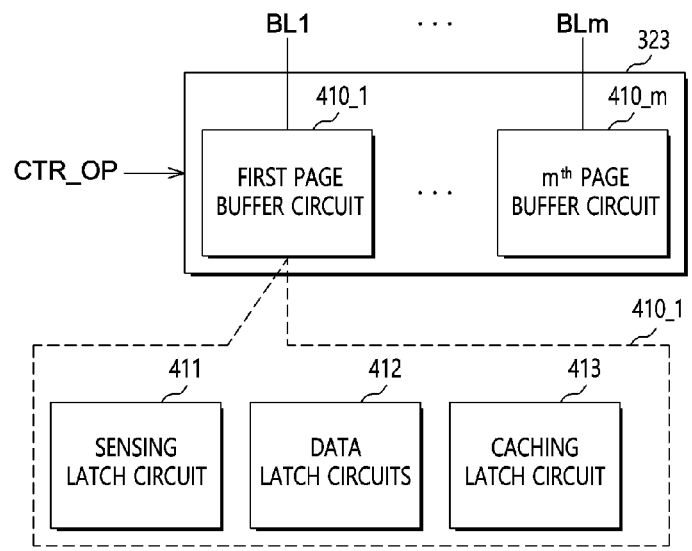
FIG. 4 is a block diagram illustrating the internal configuration of a plurality of page buffer circuits in FIG. 3.

FIG. 4 is a block diagram illustrating the internal configuration of the plurality of page buffer circuits 323 in FIG. 3.

Referring to FIG. 4, the plurality of page buffer circuits 323 may each be configured to store data that is input/output according to the program operation, the normal read operation, and the suspend read operation, based on the operation control signal CTR_OP. The plurality of page buffer circuits 323 may include first to $m^{th}$ page buffer circuits 410_1 to 410_m that are connected to the plurality of bit lines BL1 to BLm, respectively. Hereinafter, for convenience of description, the first page buffer circuit 410_1 that is connected to the first bit line BL1, among the first to $m^{th}$ page buffer circuits 410_1 to 410_m, will be representatively described.

The first page buffer circuit 410_1 may be connected to the first bit line BL1 and may be configured to store data that is input/output to/from the first bit line BL1 during the program operation, the normal read operation, and the suspend read operation. The first page buffer circuit 410_1 may include a sensing latch circuit 411 and a caching latch circuit 413.

The sensing latch circuit 411 may be configured to receive and sense data that is stored in a memory cell during the normal read operation. During the normal read operation, the sensing latch circuit 411 may retain and store previously stored data or invert and store the data according to data that is transferred through the first bit line BL1.

The caching latch circuit 413 may be configured to receive the data that is stored in the sensing latch circuit 411 and may output the received data as final data during the normal read operation. Furthermore, the caching latch circuit 413 may be configured to receive and sense the data that is stored in the memory cell and output the sensed data as the final data during the suspend read operation.

The first page buffer circuit 410_1, in accordance with an embodiment of the present disclosure, may output the final data only by using the caching latch circuit 413, without passing through the sensing latch circuit 411, during the suspend read operation. Accordingly, the first page buffer circuit 410_1 may perform the suspend read operation without an additional latch circuit.

The first page buffer circuit 410_1 may include a plurality of data latch circuits 412.

The plurality of data latch circuits 412 may be configured to store data during the program operation and the normal read operation. The number of data latch circuits within the plurality of data latch circuits 412 may be different based on the embodiment and may be designed differently according to the number of distributions of data that are stored in a memory cell. Accordingly, during the suspend read operation, the plurality of data latch circuits 412 might not store data that corresponds to the suspend read operation. As described above, the first page buffer circuit 410_1, in accordance with an embodiment of the present disclosure, may output data by using the caching latch circuit 413 during the suspend read operation.

Figure 5:
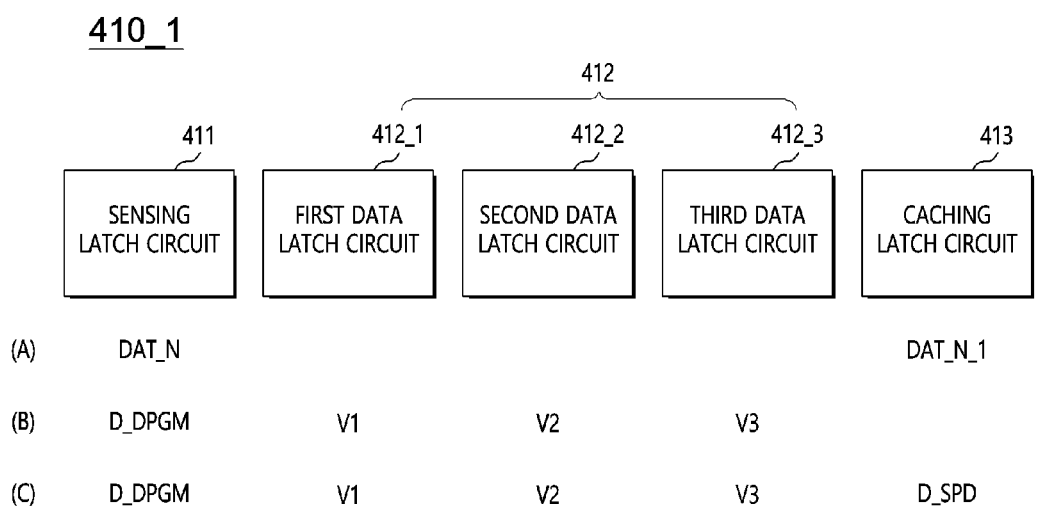
FIG. 5 is a schematic diagram for explaining various operations of a first page buffer circuit in FIG. 4.

FIG. 5 is a schematic diagram for explaining various operations of the first page buffer circuit 410_1 in FIG. 4. For convenience of description, FIG. 5 illustrates an example in which the number of the plurality of data latch circuits 412 in FIG. 4 is three. In other words, the plurality of data latch circuits 412 may include first to third data latch circuits 412_1 to 412_3.

Referring to FIG. 5, during a normal read operation A, the sensing latch circuit 411 may receive and sense data that is stored in a memory cell. Although not illustrated in the drawing, during the normal read operation A, the data that is stored in the memory cell may also be stored in the first to third data latch circuits 412_1 to 412_3. As a consequence, the sensing latch circuit 411 may store data DAT N that is currently being sensed. Subsequently, the caching latch circuit 413 may receive the data that is sensed by the sensing latch circuit 411 and output the received data as final data. Meanwhile, the caching latch circuit 413 may store previous data DAT_N_1 that is sensed before the data DAT_N is sensed by the sensing latch circuit 411. In this case, the caching latch circuit 413 may output the stored data as the final data.

Meanwhile, during a program operation B, the first to third data latch circuits 412_1 to 412_3 may store first to third verification data V1 to V3 for a verification operation of the program operation, respectively. Then, the sensing latch circuit 411 may store verification data D_DPGM for a verification operation of a double program operation.

In this case, when a suspend read operation C is performed, the caching latch circuit 413 may receive and sense data that is stored in a memory cell. In other words, the caching latch circuit 413 may directly receive data D-SPD that corresponds to the suspend read operation from the memory cell, sense the received data, and output the sensed data as final data. The data D-SPD that is stored in the caching latch circuit 413, that is, the final data, may be transferred to the memory control device 121 (see FIG. 1) via the column decoding circuit 324 and the data input/output circuit 325 in FIG. 3. For reference, the final data, which is the data D-SPD that is to be output during the suspend read operation, may also be transferred to the host device 110 without passing through the memory control device 121 in FIG. 1.

Figure 6:
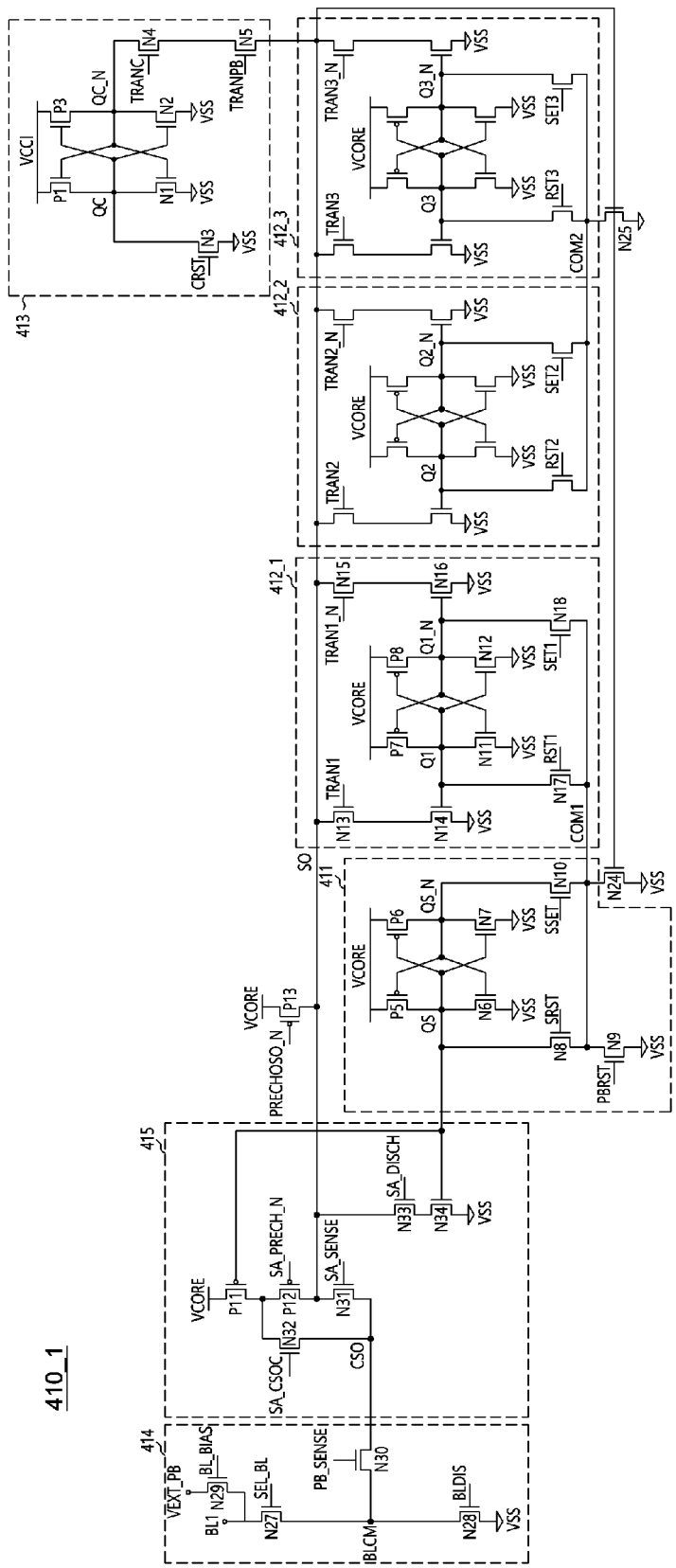
FIG. 6 is a circuit diagram illustrating the configuration of the first page buffer circuit in FIG. 5.

FIG. 6 is a circuit diagram illustrating the configuration of the first page buffer circuit 410_1 in FIG. 5.

Referring to FIG. 6, the first page buffer circuit 410_1 may include the sensing latch circuit 411, the first to third data latch circuits 412_1 to 412_3, the caching latch circuit 413, a bit line connection circuit 414, and a data sensing circuit 415.

Prior to description, the first page buffer circuit 410_1 may be controlled based on the operation control signal CTR_OP that is generated by the operation control circuit 330 in FIG. 3. That is, a plurality of control signals for controlling the first page buffer circuit 410_1 may be included in the operation control signal CTR_OP.

First, the sensing latch circuit 411 may be configured to sense and store data that is transferred through the first bit line BL1. The sensing latch circuit 411 may store data based on a sensing reset signal SRST and a sensing set signal SSET.

More specifically, the sensing latch circuit 411 may include a fifth PMOS transistor P5 and a sixth NMOS transistor N6 that are connected in series between a core voltage terminal VCORE and a ground voltage terminal VSS. The sensing latch circuit 411 may include a sixth PMOS transistor P6 and a seventh NMOS transistor N7 that are connected in series between the core voltage terminal VCORE and the ground voltage terminal VSS. The gates of the fifth PMOS transistor P5 and the sixth NMOS transistor N6 may be connected in common to a sensing bar node QS_N that is connected in common to the sixth PMOS transistor P6 and the seventh NMOS transistor N7. The gates of the sixth PMOS transistor P6 and the seventh NMOS transistor N7 may be connected in common to a sensing node QS that is connected in common to the fifth PMOS transistor P5 and the sixth NMOS transistor N6.

The sensing latch circuit 411 may include an eighth NMOS transistor N8 and a ninth NMOS transistor N9 that are connected in series between the sensing node QS and the ground voltage terminal VSS. The eighth NMOS transistor N8 may receive the sensing reset signal SRST through a gate thereof, and the ninth NMOS transistor N9 may receive a page reset signal PBRST through a gate thereof. The sensing latch circuit 411 may include a tenth NMOS transistor N10 between the sensing bar node QS_N and a first common node COM1. The tenth NMOS transistor N10 may receive the sensing set signal SSET through a gate thereof. Thus, the sensing latch circuit 411 may store data based on the sensing reset signal SRST and the sensing set signal SSET during the normal read operation.

Next, the first to third data latch circuits 412_1 to 412_3 may be configured to store verification data during the program operation. For reference, the first to third data latch circuits 412_1 to 412_3 may correspond to a triple-level cell. For example, when it is assumed that data that corresponds to a triple-level cell is programmed, the first data latch circuit 412_1 may store verification data that corresponds to a most significant bit (MSB), the second data latch circuit 412_2 may store verification data that corresponds to a central significant bit (CSB), and the third data latch circuit 412_3 may store verification data that corresponds to a least significant bit (LSB).

First, the first data latch circuit 412_1 may include a seventh PMOS transistor P7 and an $11^{th}$ NMOS transistor N11 that are connected in series between the core voltage terminal VCORE and the ground voltage terminal VSS. The first data latch circuit 412_1 may include an eighth PMOS transistor P8 and a $12^{th}$ NMOS transistor N12 that are connected in series between the core voltage terminal VCORE and the ground voltage terminal VSS. The gates of the seventh PMOS transistor P7 and the $11^{th}$ NMOS transistor N11 may be connected in common to a first data bar node Q1_N. The gates of the eighth PMOS transistor P8 and the $12^{th}$ NMOS transistor N12 may be connected in common to a first data node Q1.

The first data latch circuit 412_1 may include a 13th NMOS transistor N13 and a $14^{th}$ NMOS transistor N14 that are connected in series between a sensing node SO and the ground voltage terminal VSS. The $13^{th}$ NMOS transistor N13 may receive a first data transfer signal TRAN1 through a gate thereof, and a gate of the $14^{th}$ NMOS transistor N14 may be connected to the first data node Q1. The first data latch circuit 412_1 may include a $15^{th}$ NMOS transistor N15 and a $16^{th}$ NMOS transistor N16 that are connected in series between the sensing node SO and the ground voltage terminal VSS. The $15^{th}$ NMOS transistor N15 may receive a first data bar transfer signal TRAN1_N through a gate thereof, and a gate of the $16^{th}$ NMOS transistor N16 may be connected to the first data bar node Q1_N.

The first data latch circuit 412_1 may include a $17^{th}$ NMOS transistor N17 that is connected between the first data node Q1 and the first common node COM1. The $17^{th}$ NMOS transistor N17 may receive a first data reset signal RST1 through a gate thereof. The first data latch circuit 412_1 may include an $18^{th}$ NMOS transistor N18 that is connected between the first data bar node Q1_N and the first common node COM1. The $18^{th}$ NMOS transistor N18 may receive a first data set signal SET1 through a gate thereof.

Accordingly, the first data latch circuit 412_1 may store data based on the first data transfer signal TRAN1, the first data bar transfer signal TRAN1_N, the first data reset signal RST1, and the first data set signal SET1.

Since the first to third data latch circuits 412_1 to 412_3 have similar circuit configurations except for the input control signals, detailed description of the configurations of the second and third data latch circuits 412_2 and 412_3 will be omitted. However, the second data latch circuit 412_2 may have a second data node Q2 and a second data bar node Q2_N that are formed therein and may store data based on a second data transfer signal TRAN2, a second data bar transfer signal TRAN2_N, a second data reset signal RST2, and a second data set signal SET2. Furthermore, the third data latch circuit 412_3 may have a third data node Q3 and a third data bar node Q3_N that are formed therein and may store data based on a third data transfer signal TRAN3, a third data bar transfer signal TRAN3_N, a third data reset signal RST3, and a third data set signal SET3.

Between the ground voltage terminal VSS and the first common node COM1 that are connected in common to the sensing latch circuit 411 and the first data latch circuit 412_1, a $24^{th}$ NMOS transistor N24 may be connected. Between the ground voltage terminal VSS and a second common node COM2 that are connected in common to the second data latch circuit 412_2 and the third data latch circuit 412_3, a $25^{th}$ NMOS transistor N25 may be connected. The gates of the $24^{th}$ and $25^{th}$ NMOS transistors N24 and N25 may be connected to the sensing node SO. Thus, the $24^{th}$ and $25^{th}$ NMOS transistors N24 and N25 may form a current path that is connected to the ground voltage terminal VSS based on the voltage level of the sensing node SO.

Next, the caching latch circuit 413 may be connected to the sensing node SO during the suspend read operation and may be configured to store data.

More specifically, the caching latch circuit 413 may include a first PMOS transistor P1 and a first NMOS transistor N1 that are connected in series between a power supply voltage terminal VCCI and the ground voltage terminal VSS. The caching latch circuit 413 may include a third PMOS transistor P3 and a second NMOS transistor N2 that are connected in series between the power supply voltage terminal VCCI and the ground voltage terminal VSS. The gates of the first PMOS transistor P1 and the first NMOS transistor N1 may be connected in common to a caching bar node QC_N. The gates of the third PMOS transistor P3 and the second NMOS transistor N2 may be connected in common to a caching node QC.

The caching latch circuit 413 may include a third NMOS transistor N3 between the caching node QC and the ground voltage terminal VSS. The third NMOS transistor N3 may receive a caching reset signal CRST through a gate thereof. Accordingly, the caching latch circuit 413 may perform a reset operation on the caching node QC based on the caching reset signal CRST. Furthermore, the caching latch circuit 413 may include a fourth NMOS transistor N4 and a fifth NMOS transistor N5 that are connected in series between the caching bar node QC_N and the ground voltage terminal VSS. The fourth NMOS transistor N4 may receive a first caching transfer signal TRANC through a gate thereof, and the fifth NMOS transistor N5 may receive a second caching transfer signal TRANPB through a gate thereof.

Accordingly, the caching latch circuit 413 may store data that is transferred through the sensing node SO based on the first and second caching transfer signals TRANC and TRANPB. Particularly, during the suspend read operation, the caching latch circuit 413 may directly receive data, stored in a memory cell, through the sensing node SO other than the sensing latch circuit 411, sense the received data, and output the sensed data as final data. Although not illustrated in the drawing, the caching latch circuit 413 may be connected to the column decoding circuit 324 in FIG. 3.

Next, the bit line connection circuit 414 may be configured to connect the first bit line BL1 and a current sensing node CSO. The bit line connection circuit 414 may connect the first bit line BL1 to the current sensing node CSO based on a bit line selection signal SEL_BL, thereby transferring data to the current sensing node CSO during the normal read operation and the suspend read operation.

More specifically, the bit line connection circuit 414 may include a $27^{th}$ NMOS transistor N27 and a $28^{th}$ NMOS transistor N28 that are connected in series between the first bit line BL1 and the ground voltage terminal VSS. The $27^{th}$ NMOS transistor N27 may receive the bit line selection signal SEL_BL through a gate thereof, and the $28^{th}$ NMOS transistor N28 may receive a bit line discharge signal BLDIS through a gate thereof.

The bit line connection circuit 414 may include a $29^{th}$ NMOS transistor N29 that is connected between a buffer voltage terminal VEXT_PB and the first bit line BL1. The $29^{th}$ NMOS transistor N29 may receive an erase control voltage BL_BIAS through a gate thereof. Furthermore, the bit line connection circuit 414 may include a $30^{th}$ NMOS transistor N30 that is connected between a common node BLCM of the $27^{th}$ NMOS transistor N27 and the $28^{th}$ NMOS transistor N28 and the current sensing node CSO. The $30^{th}$ NMOS transistor N30 may receive a bit line sensing signal PB_SENSE through a gate thereof.

Accordingly, the bit line connection circuit 414 may transfer data that is transferred through the first bit line BL1 to the current sensing node CSO based on the bit line selection signal SEL_BL and the bit line sensing signal PB_SENSE.

Next, the data sensing circuit 415 may be configured to connect the current sensing node CSO and the sensing node SO. The data sensing circuit 415 may connect the current sensing node CSO and the sensing node SO based on a sensing control signal SA_SENSE, thereby transferring data to the sensing node SO during the normal read operation and the suspend read operation.

More specifically, the data sensing circuit 415 may include an $11^{th}$ PMOS transistor P11, a $12^{th}$ PMOS transistor P12, and a $31^{st}$ NMOS transistor N31 that are connected in series between the core voltage terminal VCORE and the current sensing node CSO. The gate of the $11^{th}$ PMOS transistor P11 may be connected to the sensing node QS, the $12^{th}$ PMOS transistor P12 may receive a precharge control signal SA_PRECH_N through a gate thereof, and the $31^{st}$ NMOS transistor N31 may receive the sensing control signal SA_SENSE through a gate thereof. The data sensing circuit 415 may include a $32^{nd}$ NMOS transistor N32 that is connected between a drain terminal of the $11^{th}$ PMOS transistor P11 and the current sensing node CSO. The $32^{nd}$ NMOS transistor N32 may receive a sense amplifier connection signal SA_CSOC through a gate thereof.

The data sensing circuit 415 may include a $33^{rd}$ NMOS transistor N33 and a 34th NMOS transistor N34 that are connected in series between the sensing node SO and the ground voltage terminal VSS. The $33^{rd}$ NMOS transistor N33 may receive a sense amplifier discharge signal SA_DISCH through a gate thereof, and a gate of the $34^{th}$ NMOS transistor N34 may be connected to the sensing node QS.

Accordingly, the data sensing circuit 415 may transfer data, which is transferred through the current sensing node CSO, to the sensing node SO based on the sensing control signal SA_SENSE and the sense amplifier connection signal SA_CSOC.

As a consequence, the first page buffer circuit 410_1 may transfer data that is stored in a memory cell to the sensing node SO through the bit line connection circuit 414 and the data sensing circuit 415 during the normal read operation and the suspend read operation. For reference, the bit line connection circuit 414 and the data sensing circuit 415 may be defined as a data transfer circuit that transfers the data that is stored in the memory cell to the sensing node SO.

Furthermore, the first page buffer circuit 410_1 may include a $13^{th}$ PMOS transistor P13 for precharging the sensing node SO. The $13^{th}$ PMOS transistor P13 may be connected between the core voltage terminal VCORE and the sensing node SO and may receive a precharge signal PRECHSO_N through a gate thereof. Accordingly, the $13^{th}$ PMOS transistor P13 may precharge the sensing node SO to a voltage level that corresponds to the core voltage terminal VCORE based on the precharge signal PRECHSO_N.

The first page buffer circuit 410_1, in accordance with an embodiment of the present disclosure, may include the caching latch circuit 413 that is capable of receiving data that is stored in a memory cell, sensing the received data, and outputting the sensed data as final data during a suspend read operation. As described above, the caching latch circuit 413 may be a latch circuit that is used during a normal read operation. Accordingly, the first page buffer circuit 410_1 does not require additional storage space during a suspend read operation, which makes it possible to increase the area gain and operational efficiency that correspond to the additional storage space.

Figure 7:
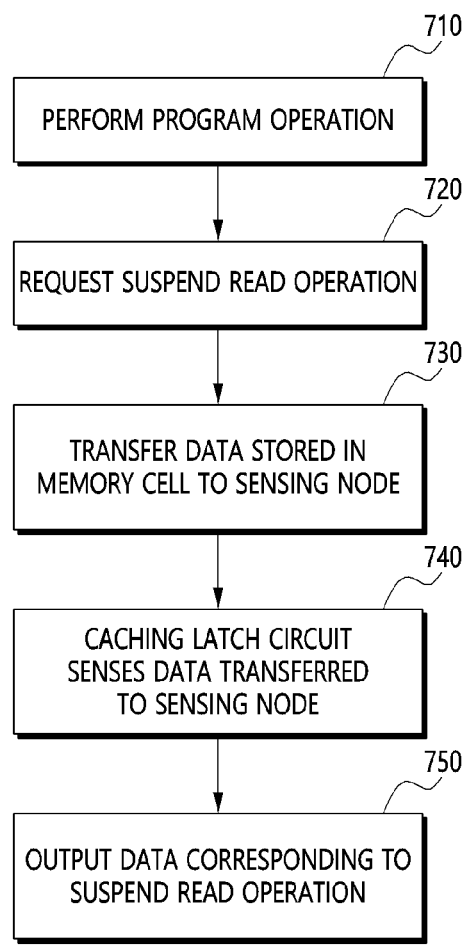
FIG. 7 is a flowchart illustrating an operating method of a semiconductor memory apparatus of FIG. 1 to FIG. 5.

FIG. 7 is a flowchart illustrating an operating method 700 of the semiconductor memory apparatus in accordance with an embodiment of the present disclosure.

Referring to FIG. 7, the operating method 700 of the semiconductor memory apparatus may include step 710 of performing a program operation, step 720 of requesting suspend read, step 730 of transferring data that is stored in a memory cell to the sensing node SO (see FIG. 6), step 740 in which the caching latch circuit 413 (see FIG. 6) senses the data that is transferred to the sensing node SO, and step 750 of outputting data that corresponds to the suspend read request.

First, step 710 of performing the program operation may be a step in which the memory device 122 (see FIG. 1) performs the program operation. As described above with reference to FIG. 1, the host device 110 may generate request information REQ that corresponds to the program operation on the memory device 122. Then, the memory device 122 of the semiconductor memory apparatus 120 may perform the program operation based on the request information REQ.

Next, step 720 of requesting the suspend read may be a step of requesting the memory device 122 (see FIG. 1) to perform a suspend read operation. As described above with reference to FIG. 1, the host device 110 may generate request information REQ that corresponds to the suspend read operation on the memory device 122. Then, the memory device 122 of the semiconductor memory apparatus 120 may perform the suspend read operation based on the request information REQ.

Next, step 730 of transferring the data that is stored in the memory cell to the sensing node SO (see FIG. 6) may be a step of transferring the data that is stored in the memory cell to the sensing node SO through the first bit line BL1 as described above with reference to FIG. 6. Step 730 of transferring the data that is stored in the memory cell to the sensing node SO may be performed by the data transfer circuit including the bit line connection circuit 414 and the data sensing circuit 415.

Next, step 740 in which the caching latch circuit 413 (see FIG. 6) senses the data transferred to the sensing node SO may be performed by the caching latch circuit 413. As described above with reference to FIG. 6, the caching latch circuit 413 may store data transferred through the sensing node SO based on the first and second caching transfer signals TRANC and TRANPB.

Next, step 750 of outputting the data that corresponds to the suspend read request may be performed by the memory device 122. As described above with reference to FIG. 6, the caching latch circuit 413 may sense and store the data that corresponds to the suspend read request. Furthermore, as described above with reference to FIG. 1, the memory device 122 may output the data that corresponds to the suspend read request and provide the output data to the memory control device 121 or the host device 110.

The semiconductor memory apparatus 120, in accordance with an embodiment of the present disclosure, may provide data that corresponds to a suspend read operation based on request information REQ that corresponds to the suspend read operation. The data that corresponds to the suspend read operation may be sensed and output through the caching latch circuit 413. Consequently, the semiconductor memory apparatus 120 does not require additional storage space during the suspend read operation, which makes it possible to increase the area gain and operational efficiency that correspond to the additional storage space.

What is claimed is:

1. A page buffer circuit comprising:
   a sensing latch circuit configured to receive and sense data that is stored in a memory cell during a normal read operation; and
   a caching latch circuit configured to receive data that is stored in the sensing latch circuit and output the received data as final data during the normal read operation and configured to receive and sense the data that is stored in the memory cell and output the sensed data as the final data during a suspend read operation,
   wherein, during the suspend read operation, the sensing latch circuit stores verification data for a program operation.

2. The page buffer circuit according to claim 1, wherein, during the normal read operation, the sensing latch circuit is configured to store data that is currently being sensed, and the caching latch circuit is configured to store previous data that is sensed before the data is sensed by the sensing latch circuit.

3. The page buffer circuit according to claim 1, further comprising:
   a plurality of data latch circuits configured to store verification data during the program operation.

4. The page buffer circuit according to claim 1, wherein the sensing latch circuit performs a verification operation during the program operation.

5. The page buffer circuit according to claim 1, further comprising:
   a data transfer circuit configured to transfer, to a sensing node, the data that is stored in the memory cell, during the normal read operation and the suspend read operation.

6. A semiconductor memory apparatus comprising:
   a memory device, including a plurality of page buffer circuits, configured to store data; and
   a memory control device configured to generate a command signal that corresponds to a suspend read operation, based on request information that corresponds to the suspend read operation during a program operation on the memory device and configured to control the memory device based on the command signal,
   wherein each of the plurality of page buffer circuits comprises:
   a sensing latch circuit configured to receive and sense data that is stored in a memory cell during a normal read operation; and
   a caching latch circuit configured to receive data that is stored in the sensing latch circuit and output the received data as final data during the normal read operation and configured to receive and sense the data that is stored in the memory cell and output the sensed data as the final data during the suspend read operation.

7. The semiconductor memory apparatus according to claim 6, wherein the memory control device is configured to generate the command signal that corresponds to the normal read operation or the suspend read operation for the memory device and configured to provide the generated command signal to the memory device.

8. The semiconductor memory apparatus according to claim 6, wherein the memory control device comprises:
   a request transmission circuit configured to receive the request information that corresponds to the suspend read operation during the program operation on the memory device; and
   a command control circuit configured to generate the command signal that corresponds to the suspend read operation based on an output signal of the request transmission circuit.

9. The semiconductor memory apparatus according to claim 8, wherein the request transmission circuit is configured to compare a latency value that corresponds to an operation that is being performed by the memory device with a latency value that corresponds to the suspend read operation and configured to provide a comparison result to the command control circuit.

10. The semiconductor memory apparatus according to claim 8, wherein the memory control device further comprises a data control circuit configured to receive data that corresponds to the suspend read operation from the memory device during the suspend read operation.

11. The semiconductor memory apparatus according to claim 6, wherein the memory device comprises:
    a memory cell array circuit configured to store the data;
    an operation driving circuit configured to drive the plurality of page buffer circuits that are connected to the memory cell array circuit; and
    an operation control circuit configured to control the operation driving circuit during the normal read operation and the suspend read operation.

12. The semiconductor memory apparatus according to claim 6, wherein, during the normal read operation, the sensing latch circuit is configured to store data that is currently being sensed, and the caching latch circuit is configured to store previous data that is sensed before the data is sensed by the sensing latch circuit.

13. The semiconductor memory apparatus according to claim 6, wherein each of the plurality of page buffer circuits further comprises:
   a plurality of data latch circuits configured to store verification data during the program operation.

14. The semiconductor memory apparatus according to claim 6, wherein the sensing latch circuit is configured to perform a verification operation during the program operation.

15. The semiconductor memory apparatus according to claim 6, wherein each of the plurality of page buffer circuits further comprises:
   a data transfer circuit configured to transfer the data that is stored in the memory cell to a sensing node during the normal read operation and the suspend read operation.

16. An operating method of a semiconductor memory apparatus, the operating method comprising:
   performing, through a memory device, a program operation;
   requesting the memory device to perform a suspend read operation;
   transferring data that is stored in a memory cell to a sensing node;
   sensing, through a caching latch circuit, the data that is transferred to the sensing node; and
   outputting data that corresponds to the suspend read operation,
   wherein, during the suspend read operation, a sensing latch circuit stores verification data for the program operation.

17. The operating method according to claim 16, wherein, during a normal read operation, the caching latch circuit is configured to receive data that is stored in the sensing latch circuit and configured to output the received data as final data.

18. The operating method according to claim 17, wherein the performing of the program operation includes the sensing latch circuit storing the verification data.

19. The operating method according to claim 16, wherein the performing of the program operation includes a plurality of data latch circuits storing a plurality of verification data.

* * * * *